(12) United States Patent
Sadler

(10) Patent No.: US 6,176,414 B1
(45) Date of Patent: Jan. 23, 2001

(54) LINKAGE GUIDED BOND HEAD

(75) Inventor: Richard D. Sadler, Quakertown, PA (US)

(73) Assignee: Kulicke & Soffa Investments, Inc., Wilmington, DE (US)

( * ) Notice: Under 35 U.S.C. 154(b), the term of this patent shall be extended for 0 days.

(21) Appl. No.: 09/436,115

(22) Filed: Nov. 8, 1999

(51) Int. Cl.[7] ............................. B23K 1/06; B23K 37/04
(52) U.S. Cl. ............................. 228/1.1; 228/4.5; 228/6.2
(58) Field of Search .................................. 228/1.1, 110.1, 228/180.5, 4.5, 6.2

(56) References Cited

U.S. PATENT DOCUMENTS

| | | |
|---|---|---|
| 3,543,988 | 12/1970 | Kulicke, Jr. . |
| 3,643,321 | 2/1972 | Field et al. . |
| 3,658,232 * | 4/1972 | Dill . |
| 3,938,797 * | 2/1976 | Frederick . |
| 4,266,710 | 5/1981 | Bilane et al. . |
| 4,340,166 | 7/1982 | Bilane et al. . |
| 4,444,349 | 4/1984 | Bilane et al. . |
| 4,598,853 | 7/1986 | Hill . |
| 5,114,302 | 5/1992 | Meisser et al. . |
| 5,174,489 * | 12/1992 | Mason . |
| 5,193,330 * | 3/1993 | Nusser . |
| 5,893,509 | 3/1999 | Pasquier . |
| 5,897,048 | 4/1999 | Cheng et al. . |

* cited by examiner

Primary Examiner—Patrick Ryan
Assistant Examiner—Jonathan Johnson
(74) Attorney, Agent, or Firm—Ratner & Prestia

(57) ABSTRACT

A bond head for use with a bonding machine. The bond head has an arm assembly; and a linkage coupled between the arm assembly and the frame of the bonding machine. The linkage forms a virtual pivot point below a lower surface of the arm assembly.

20 Claims, 8 Drawing Sheets

LINKAGE GUIDED BOND HEAD

BACKGROUND OF THE INVENTION

This invention relates generally to a tool for use in the bonding of wire to semiconductor devices and, more particularly to a linkage guided bond head for bonding a fine wire to semiconductor devices.

DESCRIPTION OF THE RELATED ART

Modern electronic equipment relies heavily on printed circuit boards on which semiconductor chips, or integrated circuits (ICs), are mounted. The mechanical and electrical connections between the chip and the substrate have posed challenges for chip designers. Three well known techniques for interconnecting the IC to the substrate are: wire bonding, tape automated bonding (TAB) and flip-chip.

The most common of these processes is wire bonding. In wire bonding, a plurality of bonding pads are located in a pattern on the top surface of the substrate, with the chip mounted in the center of the pattern of bonding pads, and the top surface of the chip facing away from the top surface of the substrate. Fine wires (which may be aluminum or gold wires) are connected between the contacts on the top surface of the chip and the contacts on the top surface of the substrate.

A wire bonding apparatus electrically connects a semiconductor chip to a substrate, using metal wires which are widely used in the manufacturing process of electronic components. A typical wire bonding machine consists of a bond head, an X-Y table, a workholder and optics.

The bond head is a mechanism which holds the bonding tool and welder (usually an ultrasonic transducer) and moves it perpendicular to the device to be bonded so that it can touch down on the spot where welding is to occur. The bond head also has wire clamps which grip the wire at the appropriate point in the bonding cycle so that the wire can be broken when the interconnection between the device and the lead frame is complete. The X-Y table is a mechanism for moving the bond head in the plane of the device so that the head can move from one bond location to another. The workholder is a mechanism that holds the work rigidly, and may also heat the device to make welding easier. The optics aim the bond head at the appropriate bond pads.

Early bond heads were aimed and moved by the machine operator. Today, conventional machines are moved by electric motors, controlled and aimed by an onboard computer, and bond up to 12 wires per second on devices that may contain in the order of 1000 bond pads.

Due to the small scale of today's integrated circuits, the bond head must be guided in its descent to the device by a mechanism which prevents any unwanted sideways motion in order to prevent the mechanism from missing a bond pad.

In conventional bonding machines two types of mechanisms are currently employed. The first mechanism is a pre-loaded linear slide mounted perpendicular to the work. The second mechanism is a ball bearing or other rotary bearing mounted in the middle of the head, allowing the bond head to pivot like a seesaw. The bonding tool is mounted at one end of the bond head and a linear electric motor is mounted at the other end of the bond head.

Linear bond heads have a disadvantage in that linear bond heads have high inertia and friction resulting in a slower mechanism as compared to a pivoting bond head. The Pivoting bond head also has a disadvantage, however, because the pivot centerline needs to be at the same height as the plane of the device to be bonded. As a result, a pivoting head cannot bond very large devices because the pivot bearing will hit the edge of a large device if it reaches out too far. This is analogous to the limit that the vertical member of a "C" clamp imposes on how far the clamp can reach, or how deep its throat is.

In FIG. 1, a conventional pivoting bonding machine 100 is shown. In FIG. 1, bonding machine 100 includes bond tool 102 attached to bond head 104. Bond tool 102 comprises ultrasonic transducer 122 and capillary 128.

As explained above, the bond head 104 pivots about bearing 106. The distance between the tip 108 of bonding tool 102 and the front portion 110 of bearing 106 is shown as distance dl. Distance $d_1$ is finite due to the design constraints of the bonding machine 100 and has a direct effect on the size of device that can be bonded by bonding machine 100. The center 112 of bearing 106 and the tip 108 of bonding tool 102 forms a pivot centerline 114 that lies in the bond plane of the device to be bonded (not shown) when the bond head 104 is in the head down (bonding) position.

FIG. 2 is a simplified side view of the conventional pivoting bond head.

SUMMARY OF THE INVENTION

To solve the aforementioned disadvantages of conventional bond heads, the present invention relates to a linkage guided bond head for use with a bonding machine.

The bond head comprises an arm assembly, and a linkage coupled between the arm assembly and the frame of the bonding machine. The linkage forms a virtual pivot point below a lower surface of the arm assembly.

The present invention further relates to an apparatus comprising a bond head disposed over a bond plane, a first linkage coupled between the bond head and the frame of a bonding machine and a second linkage coupled between the bond head and the frame the bonding machine, where the longitudinal axis of the first and second linkage intersect at a virtual point below the lower surface of the bond head.

The present invention also relates to an apparatus for bonding wires to a semiconductor device for use with a translation table. The apparatus comprises a fixed link; a coupler link; a first pivot member detachably coupled to the fixed link and the coupler link at a anterior portion of the coupler link, the first pivot member having a first longitudinal axis; a second pivot member detachably coupled to the frame member and the coupler link at a posterior portion of the coupler link, the second pivot member having a second longitudinal axis. The intersection of the first longitudinal axis and the second longitudinal axis forms a virtual pivot point below a lower surface of the coupler link.

These and other aspects of the invention are set forth below with reference to the drawings and the description of exemplary embodiments of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following Figures.

DETAILED DESCRIPTION

The present invention overcomes the deficiencies of conventional bonding machines by coupling a bond head to the frame of a bonding machine using a moveable linkage. The moveable linkage may be a leaf spring, a solid link with a bearing surface, or any other linkage that allows the bond head to move relative to the linkage and the frame.

Figure 1:
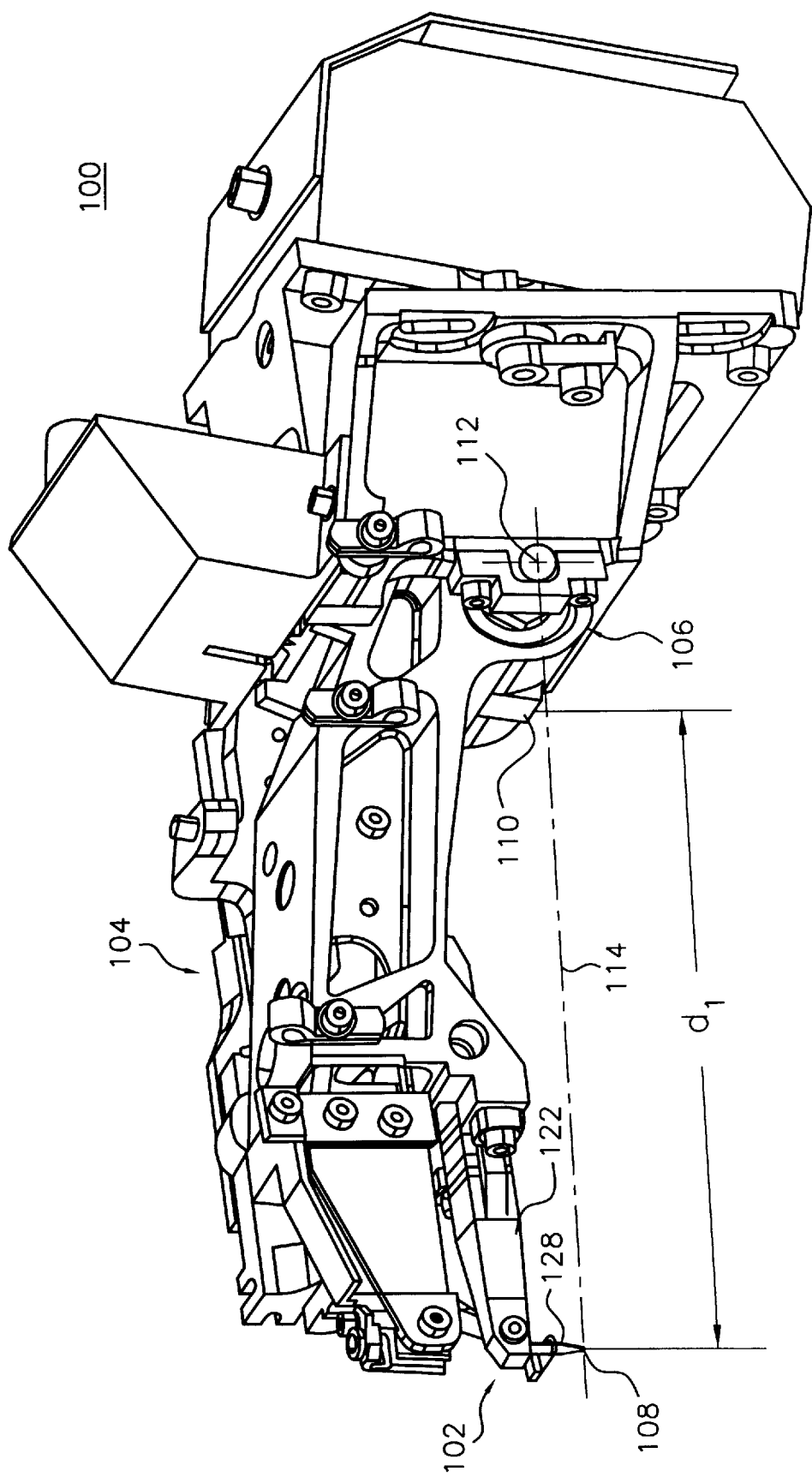
FIG. 1 is a partial perspective view of a conventional pivoting bonding machine.
Figure 2:
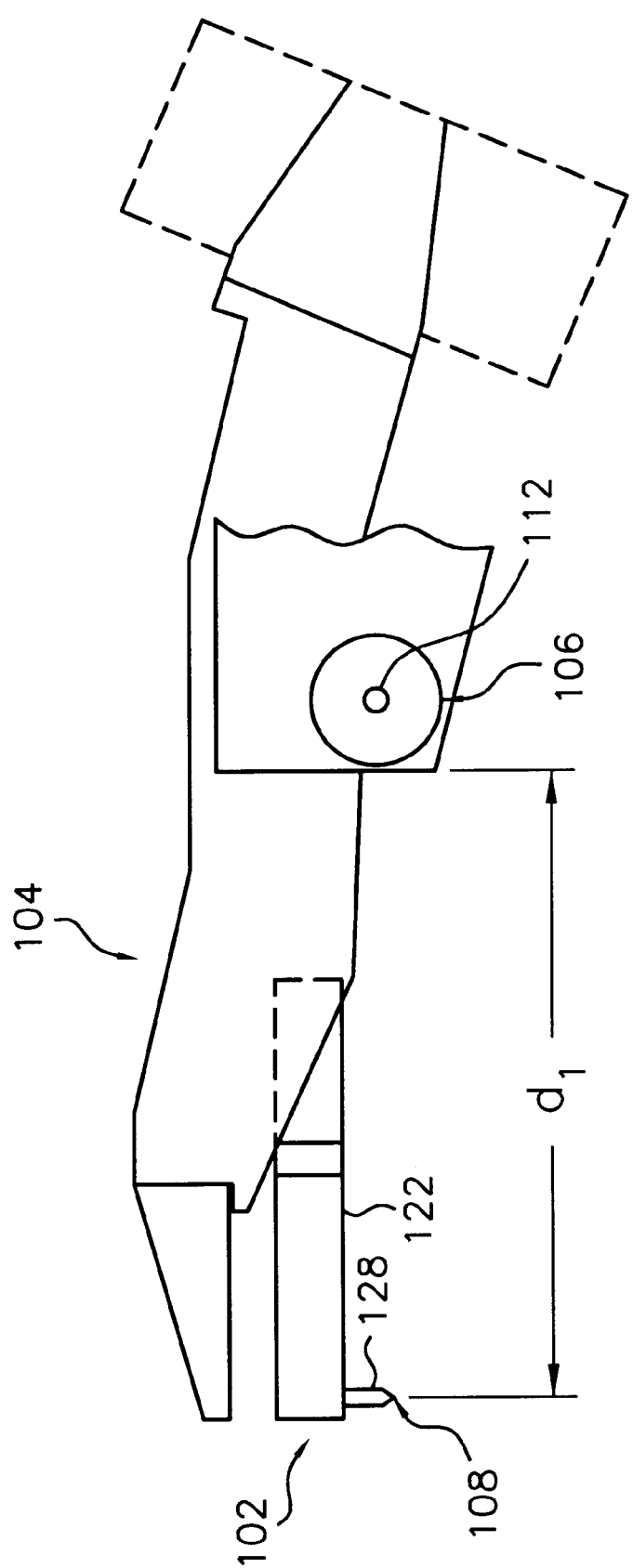
FIG. 2 is a simplified partial side view of the conventional pivoting bond head.
Figure 3:
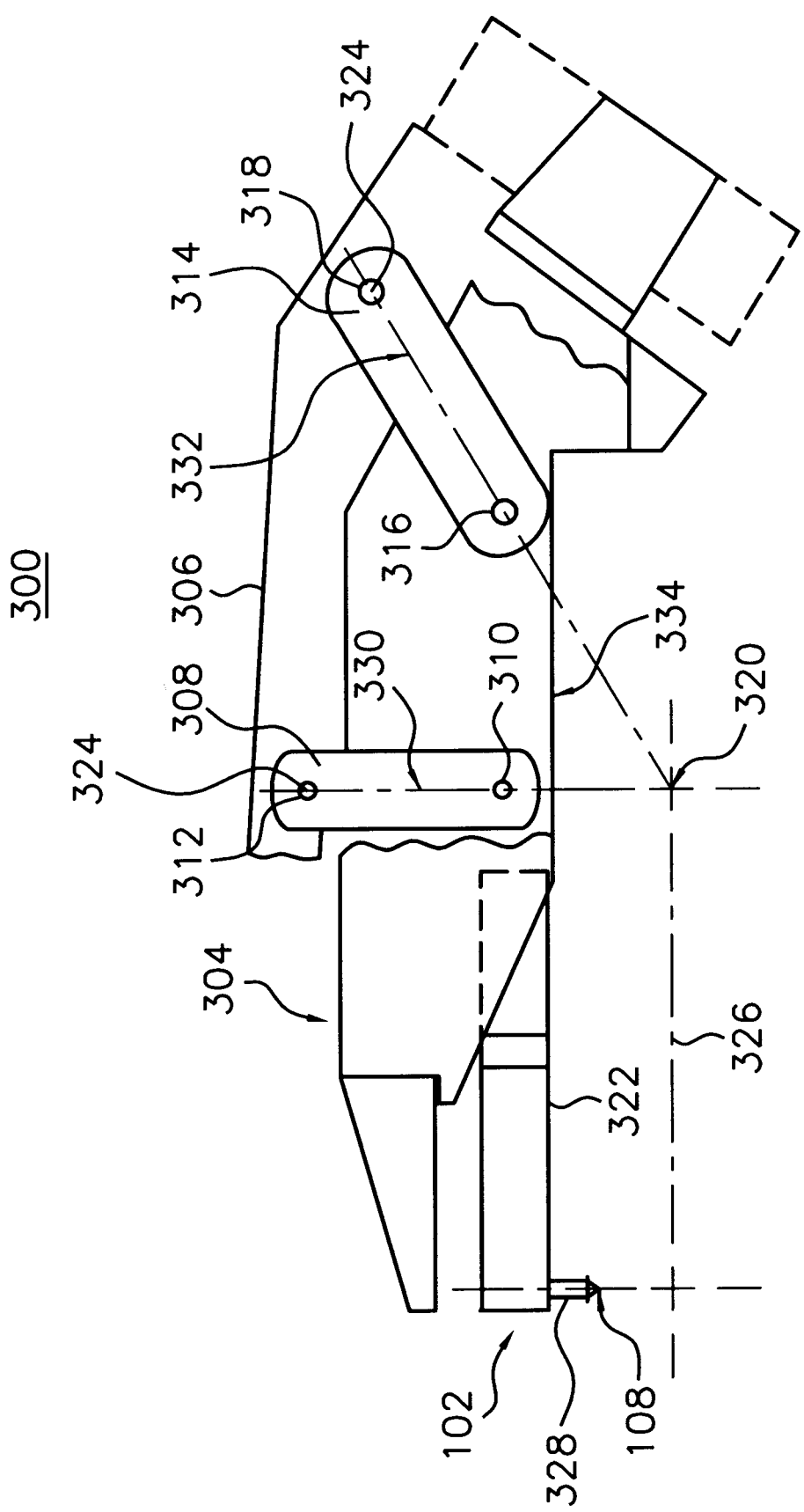
FIG. 3 is a cut away side view of a first exemplary embodiment of the present invention.

Referring to FIG. 3, a first exemplary embodiment of the present invention is shown. In FIG. 3, bond head 300 includes coupler link 304, fixed link 306, front link 308, rear link 314, and bond tool 102. In the exemplary embodiment, bond tool 102 includes ultrasonic transducer 322 and capillary 328. It is well known that capillary 328, which is used in ball bonding procedures, may be replaced with a wedge bonding tool (not shown) to carry out a wedge bonding procedure.

Front link 308 is coupled to coupler link 304 and fixed link 306 at a forward portion of coupler link 304. Similarly, rear link 314 is coupled to coupler link 304 and fixed link 306 at a rear portion of coupler link 304. As such, coupler link 304 is able to swing relative to fixed link 306 in a forward and rearward direction, thereby allowing coupler link 304 to pivot.

Front link 308 may include a bearing 310 and 312, and rear link 314 may include bearing 316 and 318 to facilitate movement of coupler link 304 relative to fixed link 306. Bearing 310, 312, 316 and 318 may be ball bearing assemblies, for example. In the exemplary embodiment, links 308 and 314 are rigid but may be flexible if desired. Links 308 and 314 may be coupled to fixed link 306 and coupler link 304 using attaching means 324. In a preferred embodiment, the links are detachably coupled to one another. It is contemplated that attaching means 324 may be screws, studs and nuts, pins, etc. for detachable coupling. If a more permanent coupling is desired, rivets may be used as attaching means 324, for example.

As shown in FIG. 3, front link 308 has a longitudinal axis 330 that intersects the longitudinal axis 332 of rear link 314 at virtual point 320. Virtual point 320 is below the lower surface 334 of coupler link 304 and lies in bond plane 326 of the device to be bonded (not shown). When the bond head is in the head down (i.e. bonding) position, tip 108 of capillary 328 will lie in bond plane 326. As is evident from FIG. 3, the distance between the upper portions of links 308 and 314 is greater than the distance between the lower portions of links 308 and 314.

Figure 4:
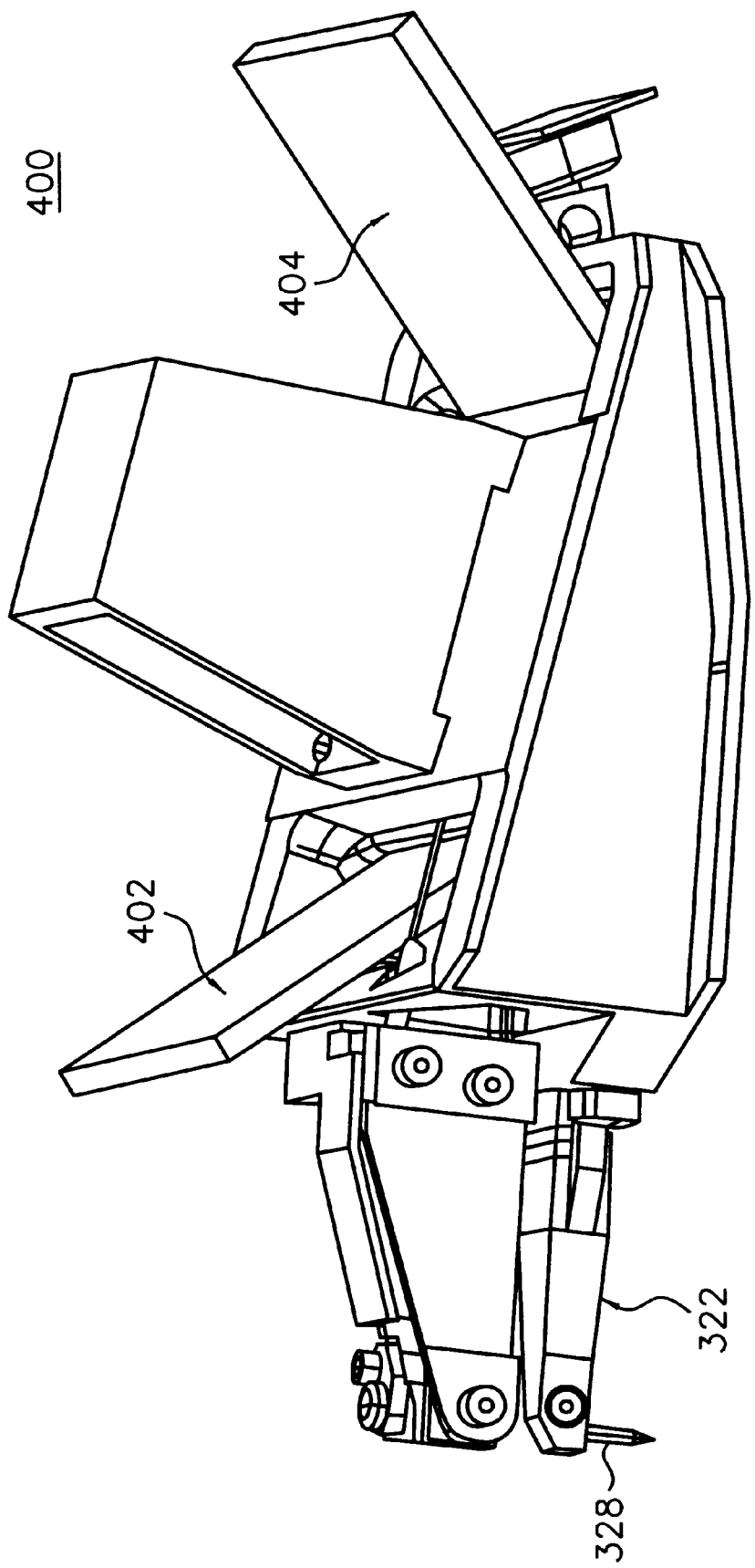
FIG. 4 is a perspective view of a second exemplary embodiment of the present invention.

Referring to FIG. 4, a perspective view of a second exemplary embodiment of the present invention is shown. In FIG. 4, leaf springs 402, 404 are used as links 308 and 314, respectively, in bond head assembly 400. In all other aspects, this embodiment is similar to the first exemplary embodiment.

Figure 5:
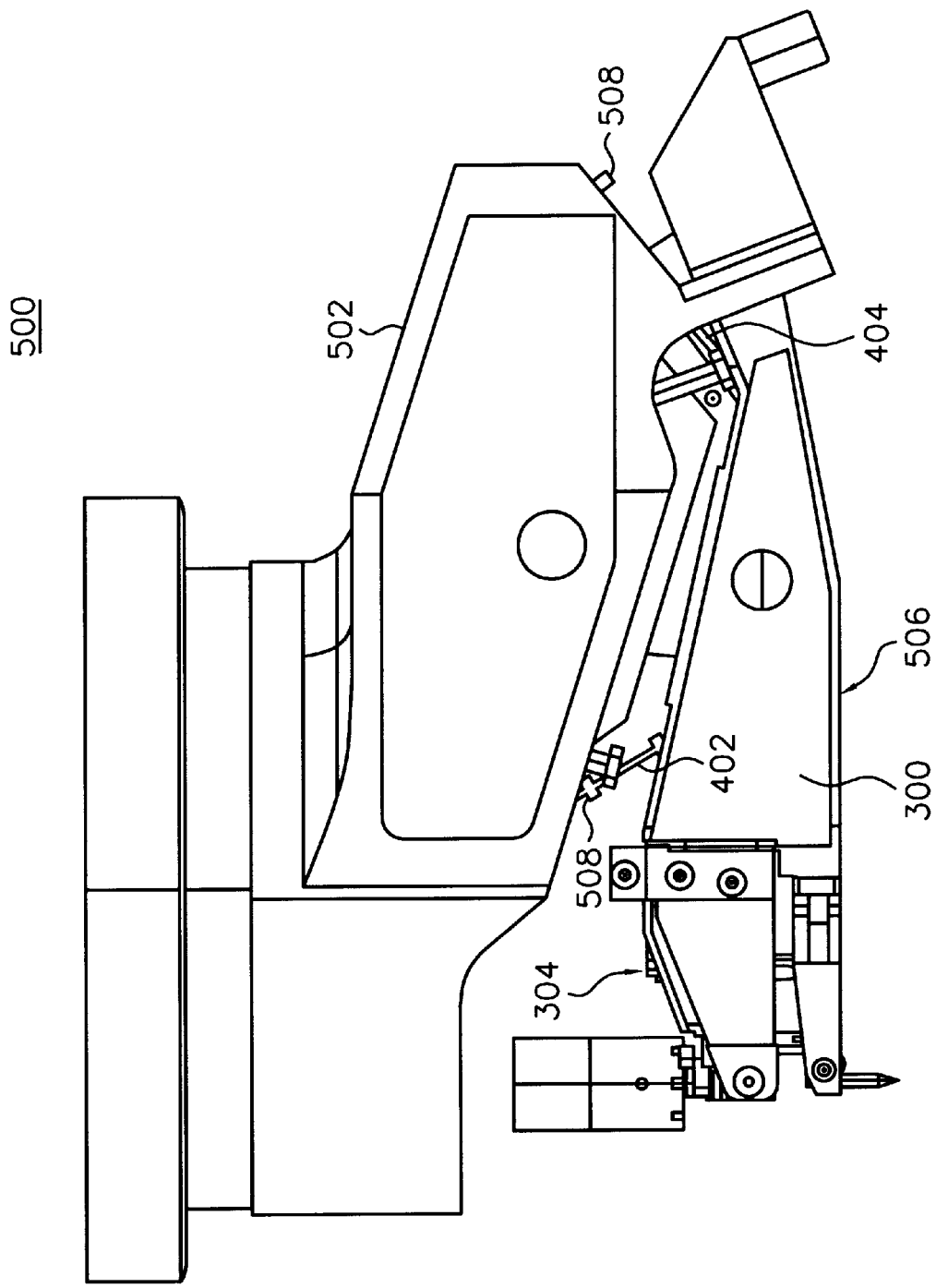
FIG. 5 is a side view of the second exemplary embodiment.

FIG. 5, is a side view of the second exemplary embodiment. In FIG. 5, bonding apparatus 500 includes bond head base 502 and bond head 300. Leaf springs 402, 404 are detachably coupled to bond head base 502 using attaching means 508. Similarly, attaching means 508 may be used to attach leaf springs 404, 404 to bond head 300 (not shown in this figure). It is contemplated that attaching means 508 may be any type of attaching means such as screws and nuts, studs and nuts, self tapping screws, etc.

The use of leaf springs 402 provides a simpler design over that of the first exemplary embodiment by providing pivoting of the bond head 300 without the use of bearings. As shown in FIG. 5, the use of the linkage arrangement of the first and second embodiments provides an unlimited throat area 506 as compared to conventional pivoting bonding machines.

Figure 7:
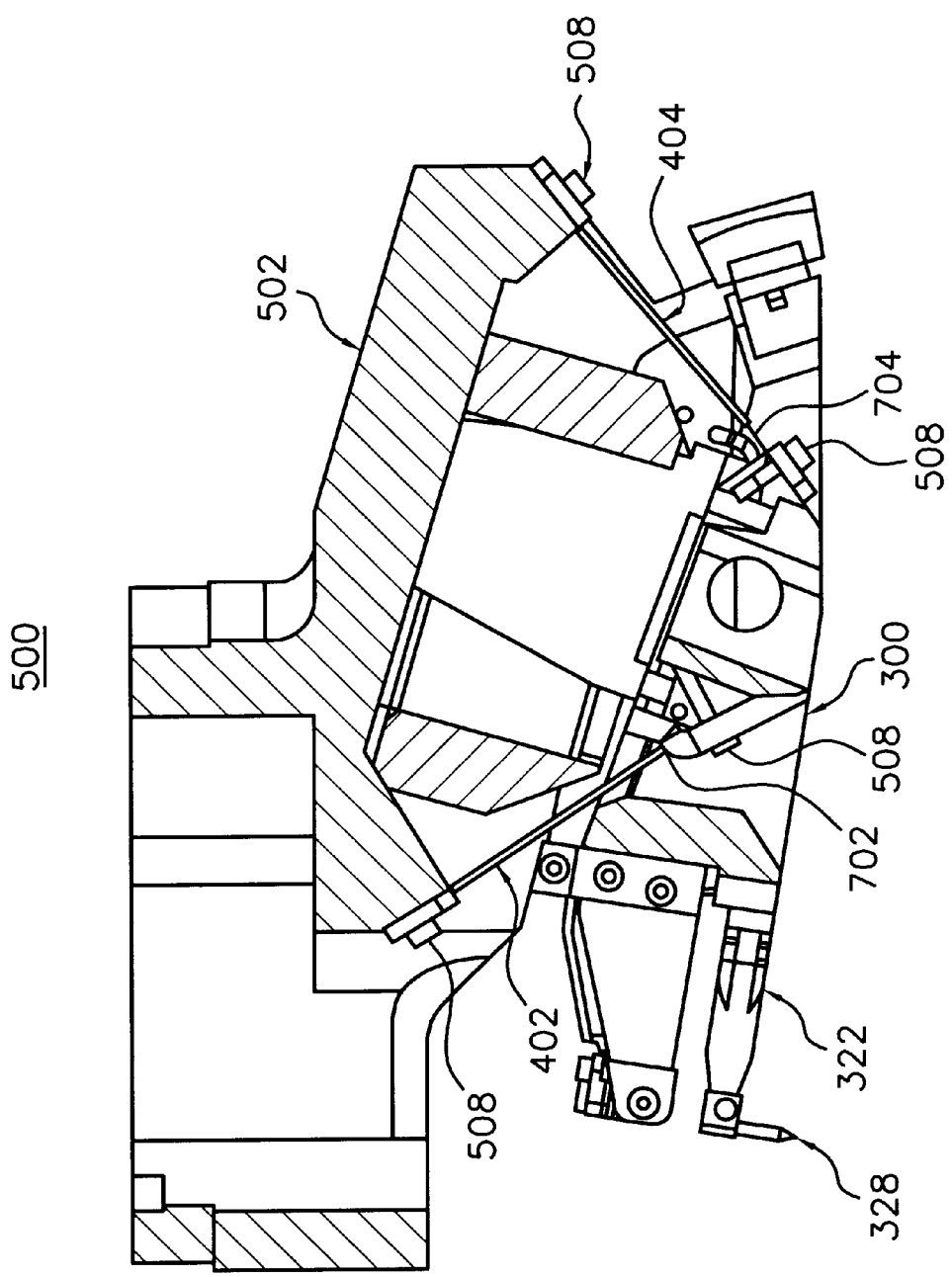
FIG. 7 is a cutaway side view of the second exemplary embodiment when the bond head is in the head up position.

FIG. 7 is cut away side view of bonding apparatus 500 in the "head up" (i.e., at rest) position. As shown in FIG. 7, leaf springs 402, 404 are attached to bond head base 502 and bond head 300 with attaching means 508. While in the head up position, leaf spring 402 is flexed at pivot point 702 in a downward direction, and leaf spring 404 is flexed at pivot point 704 in an upward direction.

Figure 8:
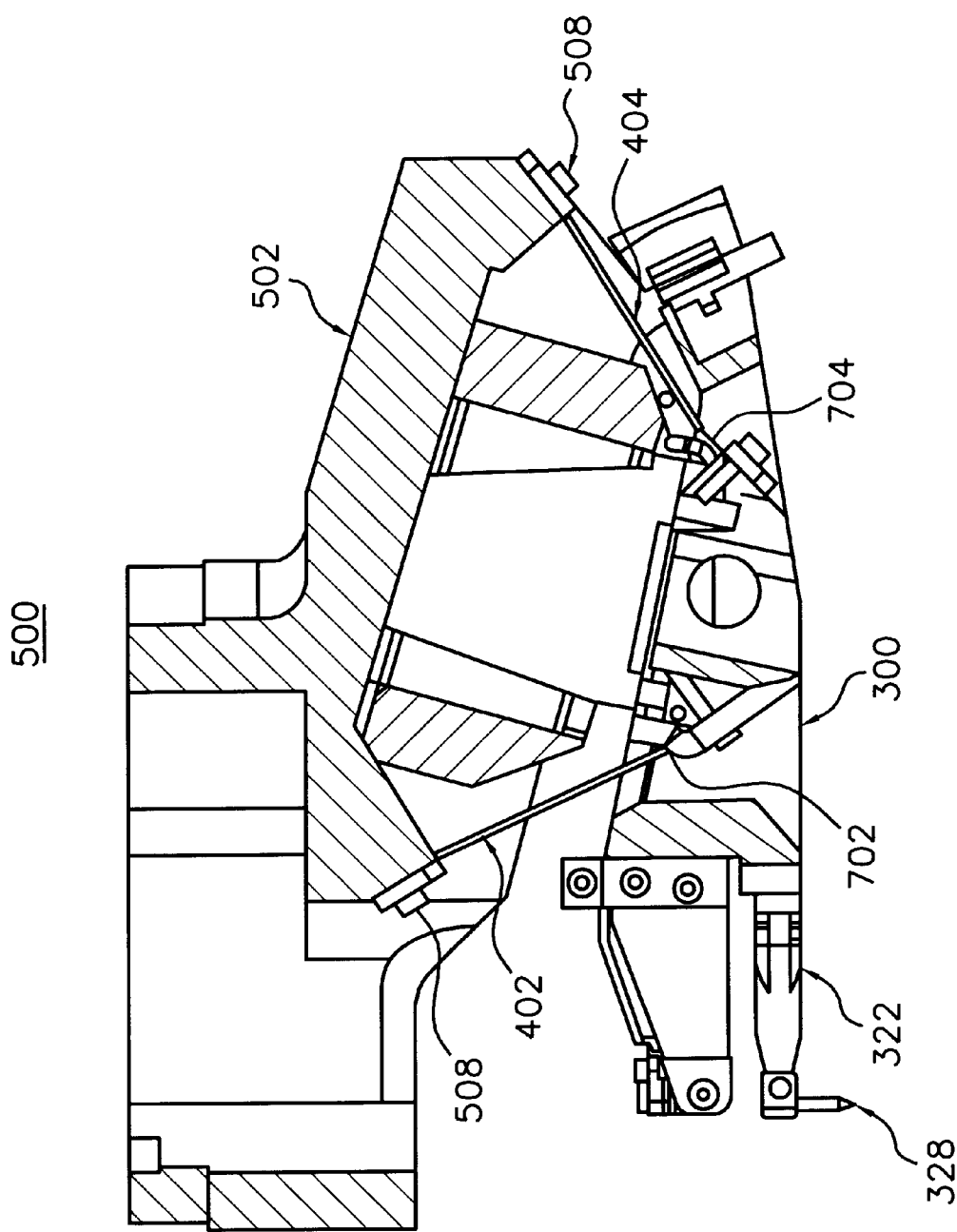
FIG. 8 is a cutaway side view of the second exemplary embodiment when the bond head is in the head down position.

FIG. 8 is cut away side view of bonding apparatus 500 in the "head down" (i.e., bonding) position. As shown in FIG. 8, leaf spring 402 is flexed at pivot point 702 in an upward direction, and leaf spring 404 is flexed at pivot point 704 in a downward direction.

Figure 6:
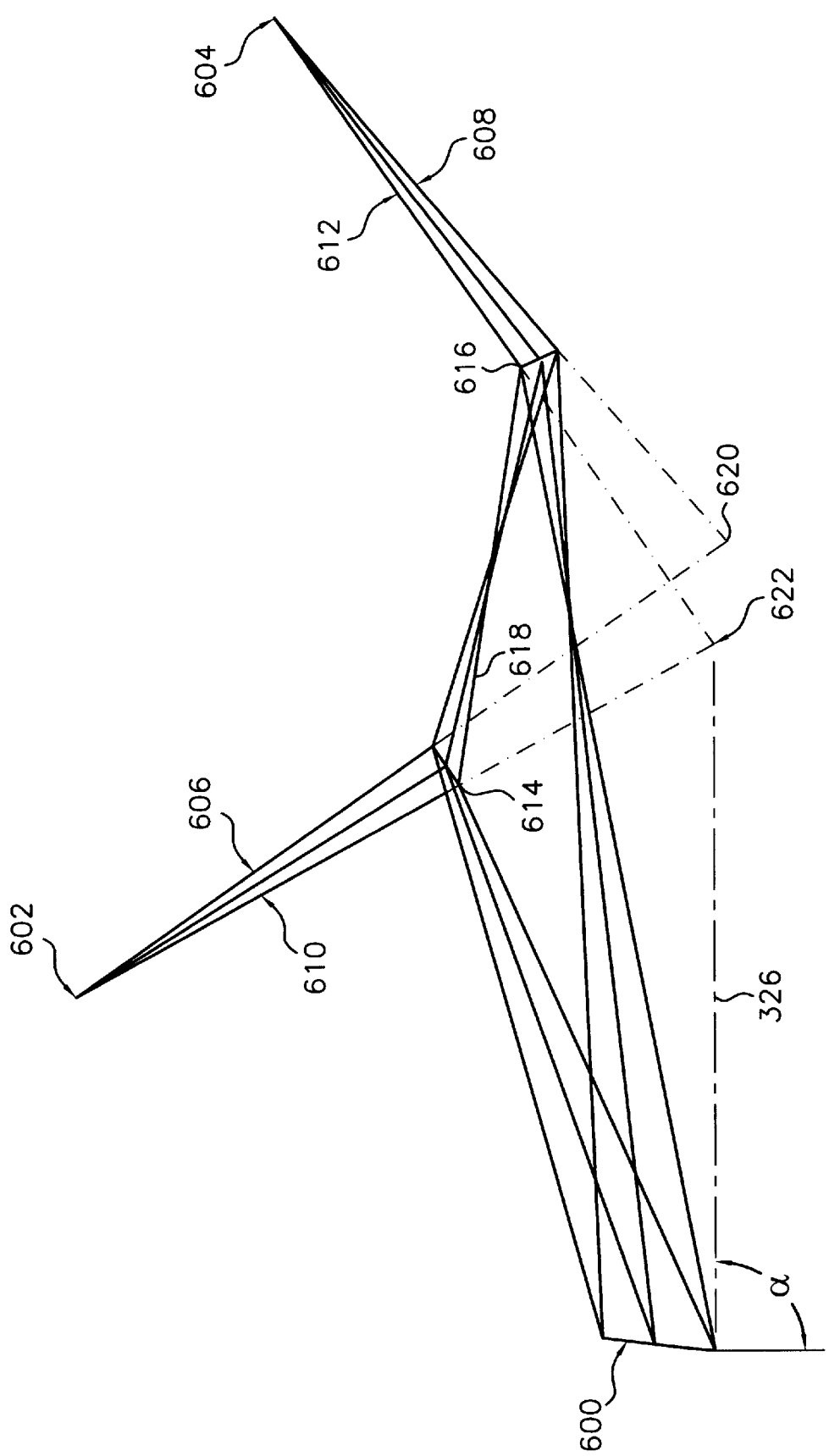
FIG. 6 is a kinematic diagram of the present invention.

FIG. 6 is a kinematic diagram of an exemplary embodiment of the present invention. In FIG. 6, 602 is the anchor point and pivot center of the front leaf spring 402; 604 is the anchor point and pivot center of the rear leaf spring 404; 606 is the position of the front leaf spring 402 when the bond head 300 is in the head up position; 608 is the position of the rear leaf spring 404 when the bond head 300 is in the head up position; 610 is the position of the front leaf spring 402 when the bond head 300 is in the head down position; 612 is the position of the rear leaf spring 404 when the bond head 300 is in the head down position; 614 is the lower front pivot point of front link 308; 616 is the lower rear pivot point of rear link 314; and 618 represents the coupler link. 600 is the path of the bond tool as the bond head 300 moves from the head up position to the head down position. The intersection of 606 and 608 (as extended) results in virtual pivot point 620 when the bond tool 300 is in the head up position, while the intersection of 610 and 612 (as extended) results in virtual pivot point 622 when the bond tool 300 is in the head down position. As discussed above, virtual pivot point 622 lies in bond plane 326. As is shown in FIG. 6, the angle α formed by path 600 and bond plane 326 is about 90°.

Although the invention has been described with reference to exemplary embodiments, it is not limited thereto. Rather, the appended claims should be construed to include other variants and embodiments of the invention which may be made by those skilled in the art without departing from the true spirit and scope of the present invention.

What is claimed:

1. A bond head for use with a bonding machine having a frame member, the bond bead comprising:
   an arm assembly; and
   two or more linkages coupled between the arm assembly and the frame member, the two or more linkages forming a virtual pivot point below a lower surface of the arm assembly.

2. The apparatus according to claim 1, wherein the two or more linkages are a leaf spring, an upper portion of the leaf spring detachably coupled to the bonding machine and a lower portion of the leaf spring detachably coupled to the arm assembly.

3. The apparatus according to claim 1, wherein the two or more linkages are a leaf spring, an upper portion of the leaf spring coupled to the bonding machine and a lower portion of the leaf spring coupled to the arm assembly.

4. The apparatus according to claim 1, wherein the arm assembly if disposed over a bond plane and the virtual pivot point is on a surface of the bond plane.

5. An apparatus for use with a bonding machine having a frame member, the apparatus comprising:
   a bond head disposed over a bond plane;
   a first linkage coupled between the bond head and the frame member at a first position on the bond head, the first linkage having a first longitudinal axis; and
   a second linkage coupled between the bond head and the frame member at a second position on the bond head, the second linkage having a second longitudinal axis,
   wherein the first longitudinal axis and the second longitudinal axis intersect at a virtual point below a lower surface of the bond head.

6. The apparatus according to claim 5, further comprising a bonding tool attached to the bond head, wherein the bonding tool moves in a first direction between an upper position and a lower position of the bond head.

7. The apparatus according to claim 6, wherein the first direction is substantially orthogonal to the bond plane.

8. The apparatus according to claim 7, wherein a lower portion of the bond tool and the virtual pivot point form an axis substantially parallel to the bond plane.

9. The apparatus according to claim 5, wherein the first linkage is a portion of a first leaf spring, an upper portion of the first leaf spring detachably coupled to the bonding machine, and the second linkage is a portion of a second leaf spring, an upper portion of the second leaf spring detachably coupled to the bonding machine, the leaf springs allowing the bond head to move relative to the linkage and the frame member.

10. The apparatus according to claim 5, wherein the first and second linkage each include a bearing allowing the bond head to move relative to the linkage and the frame member.

11. The apparatus according to claim 10, wherein the bearing is a ball bearing assembly.

12. The apparatus according to claim 5, wherein a distance between upper portions of the first and second links is greater than a distance between lower portions of the first and second links.

13. The apparatus according to claim 5, wherein the virtual point lies on a surface of the bond plane.

14. An apparatus for bonding wires to a semiconductor device for use with a translation table, the apparatus comprising:
   a fixed link;
   a coupler link;
   a first pivot member detachably coupled to the fixed link and the coupler link at a anterior portion of the coupler link, the first pivot member having a first longitudinal axis;
   a second pivot member detachably coupled to the frame member and the coupler link at a posterior portion of the coupler link, the second pivot member having a second longitudinal axis;
   wherein an intersection of the first longitudinal axis and the second longitudinal axis forms a virtual pivot point below a lower surface of the coupler link.

15. The apparatus according to claim 14, further comprising:
   an ultrasonic transducer detachably coupled to the coupler link; and
   a bonding tool coupled to the ultrasonic transducer at a front portion of the ultrasonic transducer,
   wherein a line formed between a tip of the bonding tool and the virtual pivot point lies in the bond plane.

16. The apparatus according to claim 15, wherein the bonding tool is one of a capillary and a wedge tool.

17. The apparatus according to claim 14, wherein the first pivot member is a front swing link attached to the frame member at an upper pivot of the front swing link with a first screw,
   the front swing link is attached to the coupler link at an lower pivot of the front swing link with a second screw,
   the second pivot member is a rear swing link attached to the frame member at an upper pivot of the rear swing link with a third screw, and
   the rear swing link is attached to the coupler link at an lower pivot of the rear swing link with a fourth screw.

18. The apparatus according to claim 14, further comprising:
   a front leaf spring; and
   a rear leaf spring,
   wherein the first pivot member is a lower portion of the front leaf spring and the second pivot is a lower portion of the rear leaf spring, and
   an upper portion of the front leaf spring and an upper portion of the rear leaf spring are detachably coupled to a lower portion of the bonding apparatus.

19. The apparatus according to claim 14, wherein the fixed link is attached to the translation table.

20. The apparatus according to claim 14, wherein the coupler link is disposed above a bond plane, and the virtual point lies on a surface of the bond plane.

* * * * *

UNITED STATES PATENT AND TRADE MARK OFFICE
CERTIFICATE OF CORRECTION

PATENT NO. : 6,176,414 B1
DATED : January 23, 2001
INVENTORS : Sadler

It is certified that error appears in the above-identified patent and that said Letters Patent is hereby corrected as shown below:

In column 5 of the Letters Patent, line 9, delete "if" and insert --is--.

Signed and Sealed this

Fifteenth Day of May, 2001

Attest:

NICHOLAS P. GODICI

Attesting Officer  Acting Director of the United States Patent and Trademark Office